(12) United States Patent  
Dong

(10) Patent No.: US 9,337,362 B2
(45) Date of Patent: May 10, 2016

(54) CONDUCTIVE COMPOSITION AND CONDUCTIVE FEATURE FORMED AT LOW TEMPERATURES

(75) Inventor: Chun Christine Dong, Macungie, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 84 days.

(21) Appl. No.: 13/877,824

(22) PCT Filed: Oct. 7, 2011

(86) PCT No.: PCT/US2011/055371
§ 371 (c)(1),
(2), (4) Date: May 30, 2013

(87) PCT Pub. No.: WO2012/054244
PCT Pub. Date: Apr. 26, 2012

(65) Prior Publication Data
US 2013/0252372 A1 Sep. 26, 2013

Related U.S. Application Data

(60) Provisional application No. 61/394,471, filed on Oct. 19, 2010.

(51) Int. Cl.
*H01L 31/0224* (2006.01)
*H01B 1/22* (2006.01)
*C08K 5/41* (2006.01)
*C08K 3/08* (2006.01)
*C08K 5/053* (2006.01)

(52) U.S. Cl.
CPC .......... *H01L 31/022425* (2013.01); *H01B 1/22* (2013.01); *C08K 3/08* (2013.01); *C08K 5/053* (2013.01); *C08K 5/41* (2013.01); *Y02E 10/50* (2013.01)

(58) Field of Classification Search
USPC ........................................... 252/512
See application file for complete search history.

(56) References Cited

U.S. PATENT DOCUMENTS

| 5,853,622 | A | 12/1998 | Gallagher et al. |
| 5,882,722 | A | 3/1999 | Kydd |
| 6,036,889 | A | 3/2000 | Kydd |
| 6,143,356 | A | 11/2000 | Jablonski |
| 6,153,348 | A | 11/2000 | Kydd et al. |
| 6,156,237 | A | 12/2000 | Kubota et al. |
| 6,214,527 | B1 | 4/2001 | Kosaka et al. |
| 6,274,412 | B1 | 8/2001 | Kydd et al. |
| 6,379,745 | B1 | 4/2002 | Kydd et al. |
| 6,951,666 | B2 | 10/2005 | Kodas et al. |
| 2003/0124259 | A1 | 7/2003 | Kodas et al. |
| 2004/0144958 | A1 | 7/2004 | Conaghan et al. |
| 2009/0107544 | A1 | 4/2009 | Carroll et al. |
| 2011/0111182 | A1* | 5/2011 | Stay et al. ............ 428/173 |

FOREIGN PATENT DOCUMENTS

TW 201036944 A1 10/2010

* cited by examiner

*Primary Examiner* — Alexander Ghyka
(74) *Attorney, Agent, or Firm* — Amy Carr-Trexler

(57) ABSTRACT

A method for forming a conductive feature. The method includes providing a substrate and providing a conductive composition. The conductive composition includes metal particles, a non-acid protic solvent, and a high polarity solvent. The non-acid protic solvent and high polarity solvent are present in concentrations sufficient to ionize the non-acid protic solvent and remove oxides when heated. The method further includes heating the composition to a temperature less than about 250° C. to form a conductive feature having less than about ten times the resistivity of bulk copper.

6 Claims, 1 Drawing Sheet

CONDUCTIVE COMPOSITION AND CONDUCTIVE FEATURE FORMED AT LOW TEMPERATURES

FIELD

The present disclosure relates to a process for producing conductive features and composition for forming conductive features. The processes for producing conductive features are processes that can form conductive features at low temperatures.

BACKGROUND

To alleviate an energy crisis caused by insufficient energy supply due to a continually increased energy demand and to mitigate influences on the ecology of the earth associated with conventional power generation from fossil fuels or nuclear power, there is a growing consensus on the use of sunlight as an alternative energy source since the solar energy is unlimited, clean, and ubiquitous.

Photovoltaic (PV) solar cells make it possible to convert the sunlight into electricity. However, a wide use of solar power generation depends on technology advances that lead to higher efficiency, satisfied reliability, and lower cost, thus making it more competitive with the conventional power generation methods. One of the most important and costly aspects of solar cell manufacture is the way of contact metallization (also called "electrode"), which provides electrically conducting paths on the surface of cell to collect and transfer photo converted charges to an external circuit, thus generating useful electrical energy. The reliability and efficiency of solar cells are largely affected by the nature and quality of the metal contacts.

Crystal silicon solar cells constitute an important technology in production. Crystalline solar cells are fabricated using either mono-crystalline silicon or multi-crystalline silicon as substrates. These substrates are commonly modified with a dopant of either positive or negative conductivity type, and are on the order of 50-500 microns in thickness. The surface of the substrate, such as a wafer, intended to face incident light, is designated as the front surface and the surface opposite the front surface is referred to as the back surface. By convention, positively doped silicon is commonly designated as "p", where holes are the majority electrical carriers. Negatively doped silicon is designated as "n" where electrons are the majority electrical carrier. The key to the operation of a photovoltaic cell is the creation of a p-n junction, usually formed by further doping a thin layer at the front surface of the silicon substrate. Such a layer is commonly referred to as the emitter layer, while the bulk silicon is referred to as the absorber layer. The emitter may be either p-doped or n-doped depending on the configuration of the device.

Electrodes are formed on the front and back of crystalline silicon PV devices. Electrodes on the front are typically formed using metal pastes, composed primarily of silver and silver alloys. These electrodes are deposited in arrays on the front surface of the device using techniques such as screen printing. The substrate is typically the silicon solar cell covered by a dielectric film, typically silicon nitride, that serves as an antireflective coating. Electrodes on the front or back side of the device have the requirement of high conductivity and low contact resistance.

Currently, there is a global trend in the PV industry toward developing thin film solar cells. The reason is that wafer based solar cells are difficult to mass-produce and cannot be provided inexpensively, as they require much time and energy for crystal growth and complex subsequent manufacturing steps. Amorphous silicon type solar cell is expected as one of the most promising thin film solar cells, because it has excellent characteristics such as the operability with thin films due to its great light absorption coefficient and the easy formation in large area on a low-cost or flexible substrate through relatively simple manufacturing steps.

The photoelectric conversion layer in thin film solar cells contains at least one or more p-i-n junctions and the stack of the active layer is normally microns thick, while in conventional wafer based solar cells, the active layer is typically hundreds of microns thick. Therefore, the sheet resistance of the active layer in thin film solar cells is much higher than that in wafer based cells. The high sheet resistance of the active layer retards lateral charge transfer during charge collection by front electrode. While, an increase in the density of grid lines on the sun-facing front face of the solar cell will deteriorate the shading effect on the photovoltaic junction and reduce cell output. To compensate this drawback of thin film active layer, the front electrode of thin film solar cells is generally a transparent conductive oxide (TCO), such as indium tin oxide (ITO) or zinc oxide, which enables incident light to reach the light absorbing material and serves as an ohmic contact to collect electrical charges converted there from the light radiation. The TCO also acts as an anti-reflective coating (ARC) layer. Since the resistance of TCO is intrinsically high compared with those of thick film made charge collectors, TCO must be made hundreds of nanometers to microns thick in order to create an electrode layer with a sufficient conductivity. Even though, metal grid lines are still required to be added on the TCO surface to further assist in charge collecting. An intimate contact between metal in the grid lines and TCO surface is highly desired to ensure the efficiency of the charge collecting.

Several methods are known for electrode formation. Vapor deposition or sputtering to form a conductive metal can form electrodes, but suffers from the drawback that these methods are not cost effective on large-area cell devices. One method for forming electrode on thin film and silicon wafer based PV solar cells is using screen printed thick film technology.

The quality of amorphous silicon can be easily damaged when processing temperatures subsequent to the formation of the active layers is at or above 250° C. For this reason, polymer thick film (PTF) method is desirable for forming metal grid lines. PTF pastes may contain metal particles, polymer resins, and other additives. The pastes are deposited on the TCO surface by screen printing into a grid line pattern and then curing at a relatively low temperature, such as below 250° C. After curing, metal particles are physically connected each other and fixed by a polymer matrix, thus forming a conductive film. The polymer resins or binders also provide an adhesion between PTF and TCO. However, charge collecting electrodes manufactured by these known methods suffer from the drawback of a decrease in conversion efficiency and are not satisfactory in the reliability in the prolonged use as compared with those electrodes made of metal thick film method. The drawbacks for electrodes formed from these methods include the following:

1) The resistivity of such types of collecting electrodes (approximately 30 to 50 μΩ-cm) is significantly higher than that made by metal thick film on c-Si based cells (5 to 8 μΩ-cm), leading to an increase in Joule loss and this increases the loss of conversion efficiency.
2) Polymer binders do not act as barriers to oxygen. The resistivity of the electrode increases with time due to a continual oxidation on the metal particle surface, which largely reduces the electrode durability against temperature and humidity.

3) The curing time of PTF is normally long (e.g. 30 minutes to one hour or more), which largely increases the process cycle time.

4) The solderability of the formed PTF electrode is normally poor due to insufficient and embedded metal particles.

5) Some material in PTF, such as a polymer binder, can optically degrade upon irradiation with light to cause breaking of the electrode and peeling off of the electrode from TCO surface, thus making the electrode to lose its function.

6) It is the surface oxidation of metal particles in the existing PTF technology that inhibits the use of most metals as conductive fillers. Only noble metals, such as silver, are widely used as a conductive filler material in PTF, which not only increases the material cost but also brings a silver migration problem.

Generally speaking, copper is more desirable than silver as a printed conductor due to its low material cost and favorable electrical properties, such as higher electro migration resistance and lower self diffusivity. However, copper differs from silver because it normally has a relatively thick and non conductive native oxide layer on the surface and it has a high oxidation potential, which are significant technical challenges associated with switching silver by copper for most of printed electronics applications. Therefore, the use of copper thick film for front-side contacts on thin film PV solar cells is not generally known.

Following efforts have been made by previous researchers to solve the oxidation induced degradation of electrical performance. Dielectric encapsulates have been applied to adhesives to form an oxidation barrier, but this only retards rather than prevents oxidation. Oxide-reducing agents have been added to adhesives and this approach is only effective over a short period of time. Acid anhydride epoxy hardener has also been used. The epoxy can initially reduce surface oxides, but continual aging causes the oxide to reform. Using a metal alloy powder with a low melting point as a binder to bond Ag particles into a network structure in the conductive adhesive has been pursued. However during soldering, the formed network structure can be destroyed and metal alloys have an intrinsically low electrical conductivity.

As described above, typical PTF conducting materials are made of individual particles which are physically connected each other. In contrast, PARMOD® materials disclosed by Parelec Inc. provide "chemical welding" of pure metal particles including copper. These materials are disclosed in, for example, in U.S. Pat. No. 5,882,722, U.S. Pat. No. 6,036,889, U.S. Pat. No. 6,143,356, U.S. Pat. No. 6,153,348, U.S. Pat. No. 6,274,412 B1, U.S. Pat. No. 6,379,745 B1, which are hereby incorporated by reference in their entirety. Such formed electrical conductors are in a continuous network structure, thus eliminating the oxidation induced degradation of electrical performance. In addition, PARMOD® materials can be consolidated at relatively low temperatures (e.g., 220° C.) in a forming gas environment (e.g., 5% $H_2$ in $N_2$) with an electrical resistivity better than that of Ag PTF (e.g., 21 $\mu\Omega$-cm for PARMOD® copper versus 30 to 50 $\mu\Omega$-cm for Ag PTF).

PARMOD® copper technology includes using a carboxylic acid, such as neodecanoic acid (NDA), to react with copper oxides on copper particle surface to form a copper neodecanoate (Cu NDA). The Cu NDA is then thermally decomposed into copper atoms during heating, which thus act as a "glue" to bond copper particles together into a continual network structure. Compared with conventional metal sintering, this copper sintering mechanism provides for lower process temperatures. However, the resistivity at the lowest achievable temperature for forming conductive copper(21 $\mu\Omega$-cm, 220° C.) still fails to meet the expectation for making electrodes on thin film PV solar cells. The Cu NDA in situ formed during the consolidation process requires relatively high temperatures to decompose back to copper metal, thus rending the consolidation temperatures relatively high or conductivity of the formed copper relatively low for a given low consolidation temperature (e.g. 220° C.).

In addition, PARMOD® copper conductive material does not adhere well on commonly used substrates, such as polymers, papers, and TCO surfaces. Achieving sufficient adhesion without sacrificing the desired electrical resistivity in the conductive feature is challenging. Although attempts, such as U.S. 2004/0144958 A1, which is hereby incorporated by reference in its entirety, have been made to improve adhesion of the PARMOD conductive materials, a suitable solution to this problem has still not been developed, especially for copper.

U.S. Pat. No. 6,951,666, which is hereby incorporated by reference in its entirety, describes a screen printable metal precursor composition with a viscosity above 1000 centipoises for fabricating a conductive feature on a substrate. The composition contains a metal precursor compound, a liquid vehicle, metallic particles, and other additives, such as a polymer. During heating, the metal precursor compound will convert to metal thermally or thermal-chemically. However, the U.S. Pat. No. 6,951,666 patent doesn't teach forming non-precious metal conductors, such as copper conductors, having good adherence and low resistivity. Examples of copper compositions given in the U.S. Pat. No. 6,951,666 patent have poor electrical performance. For example as introduced in the U.S. Pat. No. 6,951,666 patent, the resistivity of the formed copper after a thermal consolidation at 350° C. is 24 times of bulk copper (example 30).

One method of metal consolidation useful for forming metal devices, including electrically conductive devices is sintering. Sintering is widely used to manufacture ceramics and high temperature metals. During conventional solid-state sintering, the porosity of a powder compact is continually reduced by mass transfer from the surface of particles to the neck area of the compact at a temperature below the melting point of the solid phase. The driving force of densification is a reduction of surface energy by reducing the surface area of the solid phase. The mass transfer is derived by the differences in surface curvature and consequently the differences in vapor pressure between the surface of the particle and the neck area. This conventional solid state sintering mechanism typically requires a temperature ranging from 650° C. to 900° C. and times ranging from minutes to hours at pressures tons per square inch. These high temperatures and pressures are not suitable for use with a substrate such as a thin film PV cell.

Another commonly used mechanism for metal consolidation is sintering in the presence of a liquid phase, where the solid powders have a certain limited solubility in the liquid at the sintering temperature. The driving force for liquid phase sintering is derived from the capillary pressure of the liquid phase located between the fine solid particles. The capillary pressure provides a force to continually rearrange particles to give more effective packing. The densification of solid phase is accomplished by a solution of smaller particles and growth of larger particles by mass transfer through the liquid phase. The densification process is slowed and stopped once a solid skeleton is formed. It is believed that in the conventional liquid phase sintering, dissolution rather than precipitation is normally the rate-limiting step for the formation of the skeleton structure especially at low temperature range. Precipitation, on the other hand, directly contributes to the formation of the skeleton structure, which increases with decreasing temperature and increasing metal concentration in the liquid phase.

Accordingly, there is an industrial need on improving contact metallization system of the solar cells, such as pursuing a lower material and manufacturing costs, better electrical performance, and more satisfied long term stability, and there is a need in the art to provide a novel thick film compositions comprising metals, particularly non-precious metals such as copper, and methods comprising same. More specifically, process temperatures of the copper thick film should desirably be maintained below 250° C., or more preferably, below 200° C. to prevent thermal damage to the amorphous silicon, a strong adhesion to TCO surface, a good solderability, and no copper contamination induced shunting defect.

BRIEF SUMMARY

One aspect of the present disclosure includes a method for forming a conductive feature. The method includes providing a substrate and providing a conductive composition. The conductive composition includes metal particles, a non-acid protic solvent, and a high polarity solvent. The non-acid protic solvent and high polarity solvent are present in concentrations sufficient to ionize the non-acid protic solvent and remove oxides when heated. The method further includes heating the composition to a temperature less than about 250° C. to form a conductive feature having less than about ten times the resistivity of bulk copper.

Another aspect of the present disclosure includes a conductive composition. The conductive composition includes metal particles, a non-acid protic solvent, and a high polarity solvent. The non-acid protic solvent and high polarity solvent are present in concentrations sufficient to ionize the non-acid protic solvent and remove oxides when heated.

Other features and advantages of the present invention will be apparent from the following more detailed description of the preferred embodiment, taken in conjunction with the accompanying drawings which illustrate, by way of example, the principles of the invention.

DETAILED DESCRIPTION

The articles "a" and "an" as used herein mean one or more when applied to any feature in embodiments of the present invention described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used. The adjective "any" means one, some, or all indiscriminately of whatever quantity. The phrase "at least a portion" means "a portion or all." As used herein, "plurality" means at least two. The term "conductive" and grammatical variations thereof, as used herein, means having the property of at least some electrical conductivity.

The present disclosure includes a copper thick film technology for making charge collecting electrodes (or so called "front contacts") on transparent conductive coating (TCO) surface of thin film PV solar cells. More specifically, an industrial need is met by developing a copper thick film which has a process temperature equal to or less than about 250° C. or 200° C., a resistivity of formed copper equal to or less than ten times or equal to or less than five times of bulk copper's resistivity, an acceptable stability in electrical performance of the formed copper, a strong adhesion between copper and TCO surface, a good solderablity on formed copper grid lines, and a conductive composition formulation that does not chemically attack a TCO layer of a PV cell.

Figure 1:
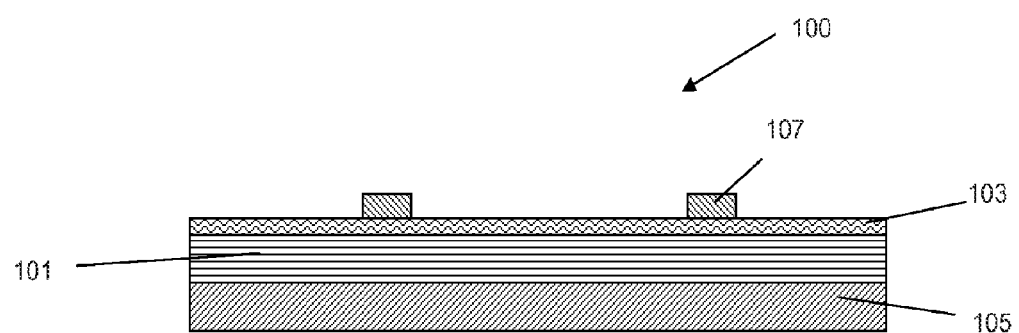
FIG. 1 is a sectional view of an exemplary thin film solar cell.

FIG. 1 shows an example of an amorphous silicon-based thin film solar cell device 100, in which a light absorbing layer 101 made of an amorphous silicon and a TCO layer 103 are deposited on an electrically conductive substrate 105. In addition, a charge collecting electrode 107 made of metal grid lines is formed on the TCO surface. When light shines on the photoelectric conversion layer from the side of the collecting electrode 107, light energy is converted into electric current and taken away from the collecting electrode and the electrically conductive substrate as the outputs.

Figure 2:
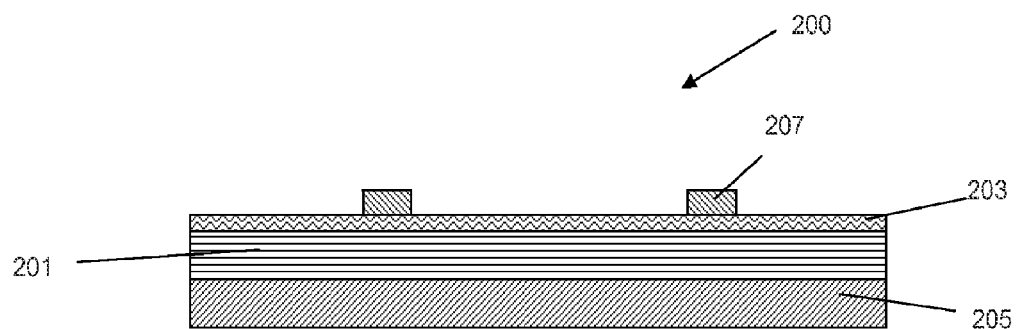
FIG. 2 is a sectional view of an exemplary crystalline silicon solar cell.

FIG. 2 shows an example of an crystalline silicon-based solar cell device 200, in which a light absorbing layer 201 made of p-n junction of crystalline silicon and an antireflective layer 203 are deposited on an electrically conductive substrate 205. In addition, a charge collecting electrode 207 made of metal grid lines is formed on the antireflective layer surface. When light shines on the photoelectric conversion layer from the side of the collecting electrode 207, light energy is converted into electric current and taken away from the collecting electrode and the electrically conductive substrate as the outputs.

Suitable substrates for depositing the conductive features include, but are not limited to, solar cell structures, such as thin film cells or crystalline solar cells. The substrate may include, for example, a thin film or a mono-crystalline or multi-crystalline silicon cell and corresponding coatings and structures. In one embodiment, the substrate is a thin film solar cell having a TCO film on the surface thereon. In another embodiment, the substrate is a crystalline solar cell having a film stack comprising an antireflective coating, and a crystalline silicon p-n junction based solar cell. In one embodiment, the antireflective coating may include a dielectric film. The dielectric film may be any suitable dielectric material such as, but not limited to silicon nitride. In other embodiments, the substrate includes a crystalline silicon solar cell and includes a patterned surface. Conductive features may be formed on the patterned surface by providing the conductive composition, such as by direct screen printing, onto the patterned surface. In certain embodiments, the patterning and/or barrier deposition on the solar cell may be coupled with application of the conductive composition. The patterned surface may be formed, for example, by removal of portions of the dielectric film. In another embodiment, a conductive composition is applied to the antireflective coating and is fired so as to etch through the antireflective coating to make ohmic contact with an underlying silicon emitter layer. In another embodiment, the patterned surface is formed by selective removal of portions of a dielectric film and deposition of a barrier layer in the removed positions. In still another embodiment, the antireflective coating is a conductive film having good surface passivation, and the conductive composition can be directly applied thereon.

Disclosed herein are conductive adhesive compositions comprising metals particularly non-precious metals that can be processed at low temperatures, such as below 250° C. or even below 200° C. for making conductive features on a TCO surface for various applications, especially for making electrodes on thin film photovoltaic (PV) cells. The invented conductive adhesive can also be applied on other substrates for other applications. The conductive compositions comprise metal particles, a non-acid protic solvent, a solvent with a high polarity and high permittivity, and optionally other additives, such as a monomer. During heating the solvent with a high polarity and high permittivity can promote oxide removal, particle fusion, and metal conversion.

The metal powder includes metal particles having a metallic phase. Suitable metals particles may include, for example copper (Cu), silver (Ag), nickel (Ni), gold (Au), palladium (Pd), indium (In), tin (Sn), other conductive metal powders and combinations thereof. In one embodiment of the disclosure, the metal particles making up the metal compact have a combination of small and large particle sizes, for example a mixture of nanometer and micrometer-sized particles. The micron-sized particles have an average particle diameter of at least about 0.1 µm. The nanometer-sized particles have an average particle diameter not greater than 100 nm. A preferred range of micron-sized particles is about 1 to 10 µm and the size selection depends on the printed dimensions (width and thickness) of the conductive feature. A preferred range of nanometer-sized particles in certain embodiments of this invention is about 40 to 60 nm due to the following reasons. For nanometer-sized particles with an average size below 40 nanometers, a liquid dispersion is normally needed to form a colloidal state of copper particles to prevent particle aggregation. The particle loading in the colloidal solution may be limited and may include, for example, particles loadings of up to about 17 wt %. In one embodiment the conductive composition includes a combination of metal powder of about 1 micron and 60 nanometers. Upon heating of the conductive composition, the smaller, nanometer scale particles have a particle size and particle distribution where the smaller particles dissolve preferentially to form metal ions. The dissolved metal ions precipitate at the neck area of larger particles of the particle compact. The dissolution and precipitation of the metal ions can be accomplished at lower temperatures, including temperatures less than about 200° C., which permits accelerated particle fusion at these lower temperatures.

The conductive composition also includes a non-acid protic solvent. The non-acid protic solvent is a solvent that has a hydrogen atom bound to an oxygen as in a hydroxyl group or a nitrogen as in an amine group. The non-acid protic solvent includes a hydroxyl-containing solvent free of carboxyl groups. While not wishing to be bound by theory, the molecules of such protic solvents under certain conditions, such as described below when mixed with a high polarity solvent, can effectively donate $H^+$ (proton) which acts as a fluxing agent to remove oxides on copper particle surface by forming water during thermal consolidation. For example, suitable non-acid protic solvents for use in the conductive composition can be those alcohols which are chemically inert to copper particles, are miscible with other liquid ingredients, have suitable boiling points (e.g. 180 to 250° C.), and relatively low vapor pressures at ambient condition. Suitable non-acid protic solvents may include, but are not limited to, ethylene glycol, diethylene glycol, and dipropylene glycol methyl ether.

In addition to the metal particles and the non-acid protic solvent, the conductive composition includes a high polarity solvent. The high polarity solvent is a solvent that has a high dipole moment (e.g., $\mu > 10.0 \times 10^{-30}$ Cm) and a high permittivity (e.g., $\epsilon_r > 25$). Suitable high polarity solvents include dimethyl sulfoxide, dimethyl propylene urea, and propylene carbonate. Other suitable high polarity solvents can also include hexamethyl phosphoric triamide (HMPT) and high polarity solvents having similar properties to HMPT. The solvent with a high polarity and permittivity can promote dissolution of copper from high curvature surface and ionization of a non-acid protic solvent during thermal consolidation process, thus enhancing particle fusion, oxide removal, and metal conversion.

The conductive composition may include additional components to provide desirable properties to the conductive composition or the conductive feature formed. For example, the conductive composition may include monomers for having an adequate adhesion to the substrate or other additives that provide desirable properties to the conductive features formed, such as a surfactant for adjusting surface tension and a liquid vehicle for adjusting rheological properties of the conductive composition to make it suitable for printing.

The conductive composition of certain embodiments of the present disclosure may be substantially devoid of or devoid of metallo-organic decomposition compounds and/or substantially devoid of metal precursor compounds. "Substantially devoid", as utilized herein, means total absence or sufficiently low concentration a compound or material such that the concentration cannot be measured or does not measurably affect the properties or chemistry of the bulk composition. Metallo-organic decomposition compounds can be any compound in which a metal atom is linked to an organic moiety through a heteroatom bond weaker than the carbon-carbon bonds of the organic moiety. Molecular metal precursor refers to a molecular compound that includes a metal atom.

The conductive composition is formed by combining metal particles with the non-acid protic solvent and polar solvent mixture to form a conductive composition. The non-acid protic solvent and high polarity solvent are present in concentrations sufficient to ionize the non-acid protic solvent and remove oxides when heated. By selecting solvents and liquid vehicles, and by adjusting particle loading, it is possible to produce a range of printable metal paste compositions having a viscosity of 20 to 100,000 centipoises for printing process, such as, but not limited to, gravure printing, flexographic printing, and screen printing. For screen printable composition, the viscosity range is 40,000 to 60,000 centipoises. To break particle aggregations, a three-roll milling process is commonly applied after mixing all the ingredients in the conductive compositions. The solvents and vehicles should have suitable vapor pressures, which should not be too high to maintain their storage and work life during printing and should not be too low as to prevent removal when their work functions are completed. The solvents and vehicles should not degrade or negatively impact the performance of the substrates to be printed, and should have low impurities, low toxicities of vapors, and possess a low tendency of leaving organic residues. In certain preferred embodiments, the conductor composition may include several solvents, vehicles, or combinations thereof wherein each constituent has a different boiling point. The gradual evaporation of liquid phase during heating can enhance particle rearrangement, volatile vapor release, and still possess the required rheology of the conductive composition for printing requirements.

To form the conductive features, the conductive composition is deposited to a substrate. As utilized herein, a "conductive feature" is a trace, contact, wire, electrode, line or other feature that has electrical conductivity. The conductive composition according to embodiments of the present disclosure may be applied to substrates using any suitable printing or application process known in the art for applying or printing thick film compositions. For example, the conductive composition may be applied to the surface by printing, such as by screen printing, the conductive composition onto selected areas of the substrate. The substrate may be any suitable material for receiving a conductive feature. One suitable substrate for use with the present disclosure is transparent conductive oxide films, such as indium tin oxide, on photovoltaic cells. Other substrates that may be used in the formation of electrical conductors include not only the conventional high temperature substrates, e.g., glass or silicon and its oxides, but also low temperature substrates such as paper and polymeric substrates. Screen and stencil printing are suitable for rigid and flexible substrates. Gravure printing, impression printing and offset printing are suitable for high production rates on flexible substrates.

After deposition, the composition described herein can be consolidated to form a mechanically cohesive and electrically conductive structure. The methods used for achieving consolidation of the deposited conductor composition can be include but not limited to a conventional heating furnace, IR, UV, laser, and microwave radiation. The conductive composition on the substrate is heated to temperatures up to about 250° C. in a reducing atmosphere. The reducing atmosphere may be, for example, hydrogen diluted with nitrogen. In another embodiment, the conductive composition is heated to a temperature up to about 200° C. in an atmosphere of hydrogen diluted with nitrogen. The conductive composition is heated at temperature for sufficient time to permit the dissolution and precipitation of the metal ions to join the metal particles to form a conductive feature. Suitable times for heating the conductive composition include time of up to about 10 minutes. The resulting conductive feature can have a resistivity of equal to or less than ten times or equal to or less than five times the resistivity of bulk copper.

While not wishing to be held by theory, the liquid phase sintering according to embodiments of the disclosure function by a mechanism, in which, the mass transfer responsible for densification is accomplished by dissolution and precipitation of metal ions, instead of metal atoms, as in the case of conventional liquid phase sintering. More specifically, a high polarity solvent is introduced in the conductive composition. During thermal consolidation process, metal ions on the surface of the metal particles will have a tendency to dissolve into the liquid phase driven by an attraction force of the liquid polar molecules until an equilibrium is reached, where an electric double layer is formed to resist further dissolution. A high metal activity and or a small size of metal particle can intensify the tendency of the dissolution.

EXAMPLES

Example 1

Ethylene glycol (EG) as a non-acid protic solvent was combined with a polar solvent named dimethyl sulfoxide (DMSO) then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.080 EG, and 0.040 DMSO. The mixture was milled by a three roll milling machine to break particle aggregates. Such prepared copper paste was then printed on an indium tin oxide (ITO) coated glass substrate and consolidated in 5% $H_2$ in $N_2$ to 165° C. with a 10 minutes holding time. The electrical resistance of the formed copper trace was measured and then transferred into electrical resistivity, which was 16.07 $\mu\Omega$-cm.

Example 2

The same composition as in example 1 was printed on an indium tin oxide (ITO) coated glass substrate and consolidated in 5% $H_2$ in $N_2$ to 180° C. with a 10 minutes holding time. The electrical resistance of the formed copper trace was measured and then transferred into electrical resistivity, which was 12.5 $\mu\Omega$-cm.

Example 3

The same composition as in example 1 was printed on an indium tin oxide (ITO) coated glass substrate and consolidated in 5% $H_2$ in $N_2$ to 200° C. with a 10 minutes holding time. The electrical resistance of the formed copper trace was measured and then transferred into electrical resistivity, which was 8.57 $\mu\Omega$-cm.

Example 4

The same composition as in example 1 was printed on an indium tin oxide (ITO) coated glass substrate and consolidated in 5% $H_2$ in $N_2$ to 220° C. with a 10 minutes holding time. The electrical resistance of the formed copper trace was measured and then transferred into electrical resistivity, which was 7.42 $\mu\Omega$-cm.

Example 5

Ethylene glycol (EG) as a non-acid protic solvent was combined with a polar solvent named dimethyl propylene urea (DMPU) then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.080 EG, and 0.040 DMPU. The mixture was milled by a three roll milling machine to break particle aggregates. Such prepared copper paste was then printed on an indium tin oxide (ITO) coated glass substrate and consolidated in 5% $H_2$ in $N_2$ to 200° C. with a 10 minutes holding time. The electrical resistance of the formed copper trace was measured and then transferred into electrical resistivity, which was 7.68 $\mu\Omega$-cm.

Example 6

The same composition as in example 5 was printed on an indium tin oxide (ITO) coated glass substrate and consolidated in 5% $H_2$ in $N_2$ to 250° C. with a 10 minutes holding time. The electrical resistance of the formed copper trace was measured and then transferred into electrical resistivity, which was 5.86 $\mu\Omega$-cm.

Example 7

Ethylene glycol (EG) as a non-acid protic solvent was combined with a polar solvent named propylene carbonate (PC) then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.080 EG, and 0.040 PC. The mixture was milled by a three roll milling machine to break particle aggregates. Such prepared copper paste was then printed on an indium tin oxide (ITO) coated glass substrate and consolidated in 5% H2 in N2 to 165° C. with a 10 minutes holding time. The electrical resistance of the formed copper trace was measured and then transferred into electrical resistivity, which was 29 $\mu\Omega$-cm.

Example 8

The same composition as in example 7 was printed on an indium tin oxide (ITO) coated glass substrate and consolidated in 5% $H_2$ in $N_2$ to 180° C. with a 10 minutes holding time. The electrical resistance of the formed copper trace was measured and then transferred into electrical resistivity, which was 7.8 $\mu\Omega$-cm.

Example 9

The same composition as in example 7 was printed on an indium tin oxide (ITO) coated glass substrate and consolidated in 5% $H_2$ in $N_2$ to 250° C. with a 10 minutes holding time. The electrical resistance of the formed copper trace was measured and then transferred into electrical resistivity, which was 4.2 $\mu\Omega$-cm.

Example 10

Dipropylene glycol methyl ether (DPGME) was combined with a polar solvent named propylene carbonate (PC) and a liquid monomer named glycerol propoxylate triacrylate (GPT), then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.06 DPGME, 0.03 PC, and 0.03 GPT. The mixture was milled by three roll milling machine to break particle aggregates. Such prepared copper paste was then printed on an indium tin oxide (ITO) coated glass substrate and consolidated in 5% $H_2$ in $N_2$ to 200° C. with a 10 minutes holding time. The electrical resistance of the formed copper trace was measured and then transferred into electrical resistivity, which was 16.6 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion.

Example 11

A solution containing 13.15 wt % oxalic acid in di(propylene glycol) methyl ether (DPGME) was prepared at room temperature. The solution was combined with a liquid monomer named glycerol propoxylate triacrylate (GPT) and a polar solvent named propylene carbonate (PC), then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.060 DPGME based solution, 0.030 PC, and 0.030 GPT. The mixture was milled by a three roll milling machine to break particle aggregates. Such prepared copper paste was then printed on an indium tin oxide (ITO) coated glass substrate and consolidated in 5% $H_2$ in $N_2$ to 200° C. with a 10 minutes holding time. The electrical resistance of the formed copper trace was measured and then transferred into electrical resistivity, which was 8.75 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion. Comparing with example 10, it is believed that an addition of oxalic acid within a certain concentration range can help oxide removal on copper particle surface, thus resulting in a reduced electrical resistivity of the formed copper conductor.

Example 12

The same composition as in example 11 was printed on a device sample containing six thin film cells of Cu(InGa)Se2 (CIGS) structure with an ITO coated surface and a glass substrate. The printed sample was consolidated in 5% $H_2$ in $N_2$ to 200° C. with a 10 minutes holding time. A cell with such printed copper has an excellent fill factor, 75.6%, and photo conversion efficiency, 13.4%. As a reference, a control piece of the device sample from the same deposition run of CIGS cells with a PVD deposited Ni/Al electrode has only 12% photo conversion efficiency. This result demonstrates a proof-of-concept for printing copper as a charge collecting electrode on thin film PV cells.

Example 13

A solution containing 26.47 wt % oxalic acid in dipropylene glycol methyl ether (DPGME) was prepared at room temperature. The solution was combined with a polar solvent named propylene carbonate (PC) and a liquid monomer named glycerol propoxylate triacrylate (GPT), then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.06 DPGME based solution, 0.03 PC, and 0.03 GPT. The mixture was milled by three roll milling machine to break particle aggregates. Such prepared copper paste was then printed on an indium tin oxide (ITO) coated glass substrate and consolidated in 5% $H_2$ in $N_2$ to 200° C. with a 10 minutes holding time. The electrical resistance of the formed copper trace was measured and then transferred into electrical resistivity, which was 10.1 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion. It is believed that the reduction of oxides on copper particles surface by oxalic acid forms copper oxalate which can't be thermally converted to copper at 200° C., thus acting as a non-conductive residue at the process temperature. Therefore, comparing examples 11 and 13, when the amount of oxalic acid in the conductive composition is above a certain concentration range, the electrical resistivity of the formed copper conductor will be sacrificed by the presence of the non conductive copper oxalate.

Example 14

Diethylene glycol (DEG) as a non-acid protic solvent was combined with a polar solvent named propylene carbonate (PC) and a liquid monomer named glycerol propoxylate triacrylate (GPT), then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.06 DEG, 0.03 PC, and 0.03 GPT. The mixture was milled by three roll milling machine to break particle aggregates. Such prepared copper paste was then printed on an indium tin oxide (ITO) coated glass substrate and consolidated in 5% $H_2$ in $N_2$ to 200° C. with a 10 minutes holding time. The electrical resistance of the formed copper trace was measured and then transferred into electrical resistivity, which was 9.0 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion.

Example 15

Diethylene glycol (DEG) as a non-acid protic solvent was combined with a polar solvent named propylene carbonate (PC) and a liquid monomer named glycerol propoxylate triacrylate (GPT), then mixed with micron-sized and nanometer-sized copper powders. The average diameters of the two size ranges of copper powders are 1 micron and 60 nanometer, respectively. The ratios of each ingredient in the mixture are 0.698 micron powder, 0.181 nanometer powder, 0.06 DEG, 0.03 PC, and 0.03 GPT. The mixture was milled by three roll milling machine to break particle aggregates. Such prepared copper paste was then printed on an indium tin oxide (ITO) coated glass substrate and consolidated in 5% $H_2$ in $N_2$ to 180° C. with a 10 minutes holding time. The electrical resistance of the formed copper trace was measured and then transferred into electrical resistivity, which was 14.7 $\mu\Omega$-cm. Scotch tape was applied to the trace and immediately removed by pulling at a 90 degree angle to determine the adhesion strength of the formed copper trace on ITO surface. There was no copper trace was removed by the tape, indicating a strong adhesion.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A conductive composition comprising:
   copper powder;
   a non-acid protic solvent; and
   a high polarity solvent; and
   wherein the high polarity solvent has a dipole moment, $\mu$, greater than $10.0 \times 10^{-30}$ Cm and a permittivity, $\in_r$, greater than 25, and wherein the conductive composition, upon heating, is cured and forms a conductive feature on a substrate, the conductive feature having a resistivity of less than about ten times that of bulk copper, and wherein the non-acid protic solvent and high polarity solvent are used in concentrations sufficient to generate ions from the non-acid protic solvent which act as a fluxing agent to remove oxides from the surface of the copper powder during formation of the conductive feature.

2. The composition of claim 1, wherein the copper powder includes a combination of nanometer and micrometer-sized particles.

3. The composition of claim 1, wherein the non-acid protic solvent is ethylene glycol.

4. The composition of claim 1, wherein the high polarity solvent is dimethyl sulfoxide.

5. The composition of claim 1, wherein the conductive composition is substantially devoid of metal precursor compounds.

6. The composition of claim 1, wherein the composition is cured at a temperature of up to about 250° C., for about 10 minutes.

* * * * *